United States Patent
Guo et al.

(10) Patent No.: US 8,829,989 B2
(45) Date of Patent: Sep. 9, 2014

(54) DC OFFSET CANCELLATION FOR A MULTI-STAGE AMPLIFIER

(71) Applicant: Hong Kong Applied Science and Technology Research Institute Company Limited, Hong Kong (HK)

(72) Inventors: Huimin Guo, Hong Kong (HK); Kai Cheung Chung, Hong Kong (HK); Gang Qian, Hong Kong (HK)

(73) Assignee: Hong Kong Applied Science and Technology Research Institute Company Limited, Hong Kong Science Park Shatin, New Territories, Hong Kong (CN)

( * ) Notice: Subject to any disclaimer, the term of this patent is extended or adjusted under 35 U.S.C. 154(b) by 99 days.

(21) Appl. No.: 13/721,017

(22) Filed: Dec. 20, 2012

(65) Prior Publication Data

US 2014/0176238 A1   Jun. 26, 2014

(51) Int. Cl.
*H03F 1/02* (2006.01)
*H03F 3/45* (2006.01)

(52) U.S. Cl.
CPC ................................. *H03F 3/45071* (2013.01)
USPC ................................................. 330/9; 330/69

(58) Field of Classification Search
CPC . H03F 3/456; H03F 3/45798; H03F 3/45896; H03F 3/45973
USPC ..................... 330/9, 69; 327/124, 307
See application file for complete search history.

(56) References Cited

U.S. PATENT DOCUMENTS

| | | | |
|---|---|---|---|
| 6,597,302 B2 * | 7/2003 | Nagaraj et al. | 341/155 |
| 7,203,476 B2 | 4/2007 | Ruelke et al. | |
| 7,215,266 B2 | 5/2007 | Li et al. | |
| 7,265,611 B2 * | 9/2007 | Wang | 330/9 |
| 7,348,839 B2 * | 3/2008 | Fahim et al. | 330/9 |
| 7,969,222 B2 | 6/2011 | Bouras | |
| 8,260,227 B2 | 9/2012 | Chiu | |
| 2005/0110550 A1 | 5/2005 | Shi et al. | |

* cited by examiner

*Primary Examiner* — Steven J Mottola
(74) *Attorney, Agent, or Firm* — Ella Cheong Hong Kong; Sam T. Yip

(57) ABSTRACT

This invention provides a multi-stage amplifier incorporating DC offset cancellation. The amplifier has a plurality of series-connected gain stages each of which comprises a differential amplifier unit generating a pair of differential outputs from a pair of differential inputs. In particular, a trailing stage in the plurality of gain stages comprises a digital DC offset cancellation module configured to compensate for a DC offset of the trailing stage's differential amplifier unit. The digital DC offset cancellation module comprises a comparator coupled to the pair of differential outputs of the trailing stage's differential amplifier unit for receiving such differential outputs as inputs for the comparator. Preferably, the comparator has an inherent DC offset that is substantially small. It is preferable that a non-trailing stage of the amplifier comprises an analog DC offset cancellation module for compensating for a DC offset of the non-trailing stage.

19 Claims, 4 Drawing Sheets

(DCOC: DC offset cancellation)

(DCOC: DC offset cancellation)

DC OFFSET CANCELLATION FOR A MULTI-STAGE AMPLIFIER

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention relates generally to DC offset cancellation for a multi-stage amplifier. In particular, this invention relates to hybrid DC offset cancellation involving a combination of digital DC offset cancellation and analog DC offset cancellation.

BACKGROUND

A direct-conversion receiver has gained popularity for use in multi-band, multi-standard communication systems. Despite this, the presence of DC offset is typically a problem for this receiver. In this receiver, a programmable gain amplifier is usually used. As the programmable gain amplifier usually provides a large gain, it is possible that a large DC offset can lead to saturation of the amplifier. Furthermore, a large DC offset may also saturate an analog-to-digital converter (ADC) that follows the amplifier. It is also common that a change of the gain of the programmable gain amplifier can lead to a change of the DC offset. It is desirable to minimize the DC offset for an amplifier, especially a programmable gain amplifier.

In the art, DC offset cancellers based on analog circuits have been disclosed in, e.g., US20050110550 and U.S. Pat. No. 7,969,222. Typically, an analog DC offset canceller employs a negative feedback circuit to compensate for an inherent DC offset of a target amplifier. A sensing amplifier is used for performing low-pass filtering in the negative feedback circuit. The presence of an inherent DC offset in the sensing amplifier causes a residual DC offset appeared at an output of the target amplifier. This residual DC offset is random for different integrated-circuit implementations of the analog DC offset canceller. In U.S. Pat. No. 8,260,227, an analog DC offset canceller is disclosed. This canceller is implemented after the gain stage so that the possibility of amplifier saturation is still present.

Digital DC offset cancellers have also been disclosed in the art. In U.S. Pat. No. 7,215,266, a post-amplification digital DC offset canceller is disclosed. Since the cancellation is done by correcting the DC offset after amplification, there is a possibility of amplifier saturation.

U.S. Pat. No. 7,203,476 discloses a hybrid implementation of a DC offset canceller by combining a digital DC offset correction scheme with an analog one. An ADC is required to convert the target amplifier's output for processing by the digital canceller. It increases the chip area consumed in the integrated-circuit implementation. In addition, the offset cancellation algorithm is complicated, thereby further increasing the required chip area. The digital DC offset canceller also has a longer response time than an analog one does in general.

A multi-stage amplifier is of growing importance for realizing a programmable gain amplifier having a wide range of settable gain. There is a need in the art for DC offset cancellers that enables reduction of the residual DC offset for a multi-stage amplifier without the need for an ADC, which is a chip-area-consuming feature.

SUMMARY OF THE INVENTION

A multi-stage amplifier incorporating DC offset cancellation for reducing a residual DC offset at the output of the amplifier is provided. The multi-stage amplifier has a plurality of series-connected gain stages each of which comprises a differential amplifier unit configured to generate a pair of differential outputs from a pair of differential inputs. In particular, a trailing stage in the plurality of series-connected gain stages comprises a digital DC offset cancellation module configured to compensate for a DC offset of the trailing stage's differential amplifier unit. Furthermore, the digital DC offset cancellation module comprises a comparator coupled to the pair of differential outputs of the trailing stage's differential amplifier unit for receiving such pair of differential outputs as a pair of inputs for the comparator. Preferably, the comparator is configured to have an inherent DC offset that is substantially small. An auto-zero voltage comparator may be used as the comparator.

In one embodiment, the digital DC offset cancellation module includes a digital-to-analog converter (DAC) having a pair of DAC outputs coupled to the pair of differential inputs of the trailing stage's differential amplifier unit, for generating a pair of controllable currents at the pair of DAC outputs in order to introduce an additional voltage difference across the differential inputs of the trailing stage's differential amplifier unit. The digital DC offset cancellation module further includes a digital calibration module configured to, based on an output of the comparator as input information, control the DAC to generate the pair of controllable currents so as to compensate for the DC offset of the trailing stage's differential amplifier unit. Thereby, the DC offset can be compensated for without involving an ADC. The digital calibration module may use Successive Approximation Register (SAR) logic.

It is preferable that a non-trailing stage of the multi-stage amplifier comprises an analog DC offset cancellation module configured to compensate for a DC offset of the non-trailing stage. The non-trailing stage may be programmable in gain. In one embodiment, the analog DC offset cancellation module comprises: an input resistor ladder having a pair of ends coupled to the pair of differential outputs of the non-trailing stage's differential amplifier unit; a low-pass filter generating a first filter output and a second filter output, for low-pass filtering a first filter input and a second filter input both obtained from the input resistor ladder; a first output resistor, a first end of which connects to the first filter output and a second end of which connects to one of the differential inputs of the non-trailing stage's differential amplifier unit; and a second output resistor, a first end of which connects to the second filter output and a second end of which connects to another one of the differential inputs of the non-trailing stage's differential amplifier unit.

A method for compensating for a DC offset of a multi-stage amplifier is also disclosed. The method uses a digital DC offset cancellation module to compensate for a DC offset of a trailing stage's differential amplifier unit, wherein the digital DC offset cancellation module has a comparator coupled to a pair of differential outputs of the differential amplifier unit for receiving such pair of differential outputs as a pair of inputs for the comparator. It is preferable that the comparator is configured to have an inherent DC offset that is substantially small. An auto-zero voltage comparator may be used as the comparator.

Preferably, the method further comprises using an analog DC offset cancellation module to compensate for a DC offset of a non-trailing stage of the multi-stage amplifier.

DETAILED DESCRIPTION OF THE INVENTION

A multi-stage amplifier comprises a plurality of series-connected gain stages, where the number of gain stages is at least two. Optionally, one or more of the series-connected gain stages are programmable in gain, so that the multi-stage amplifier has a gain that is programmable.

Figure 1:
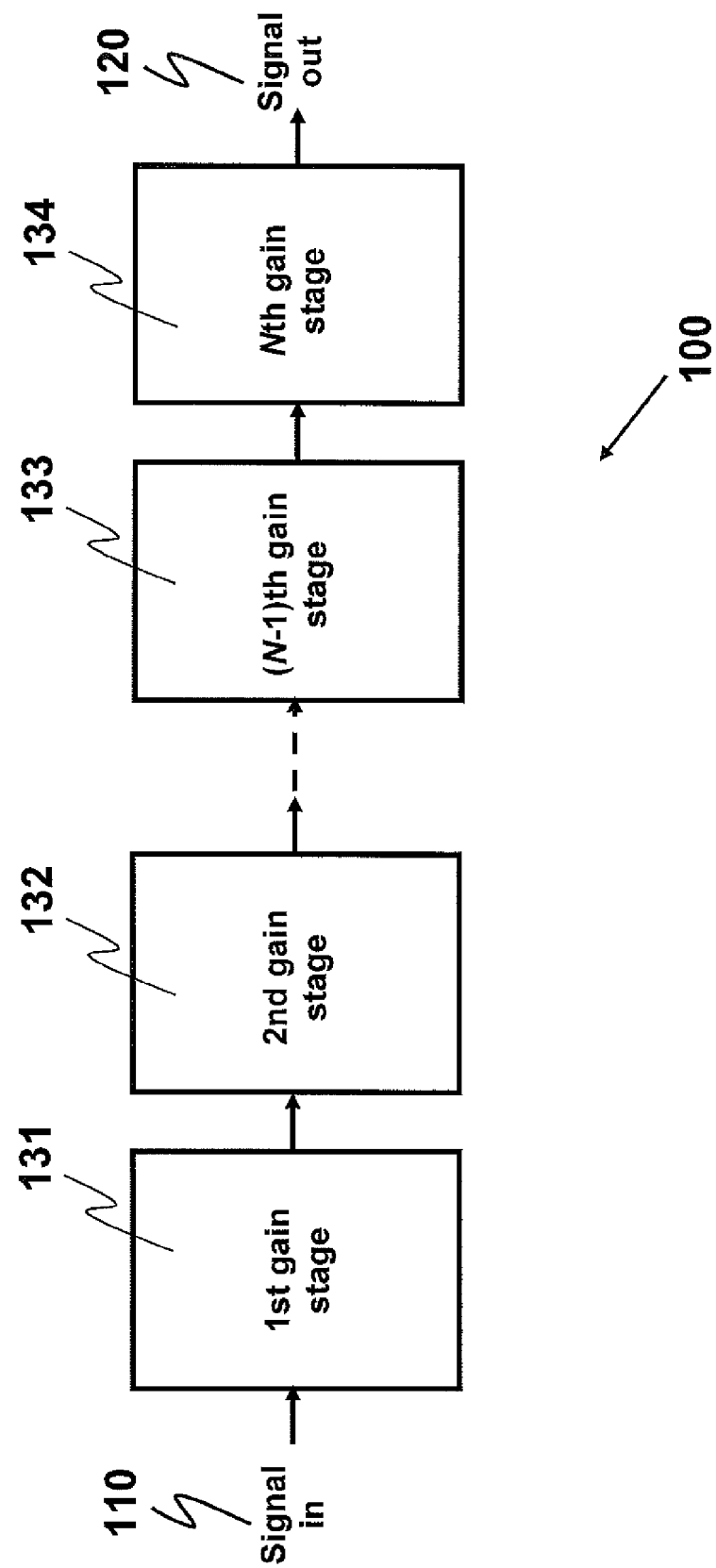
FIG. 1 depicts an example of a multi-stage amplifier.

FIG. 1 illustrates an example of the multi-stage amplifier. A multi-stage amplifier 100 comprises N gain stages, including a first gain stage 131, a second gain stage 132, an (N−1)th gain stage 133 and an Nth gain stage 134. An input signal 110 is amplified in the first gain stage 131. The amplified signal at an output of the first gain stage 131 is fed to the second gain stage 132. This process repeats for subsequent gain stages up to the Nth gain stage 134, an output of which yields an output signal 120 of the multi-stage amplifier 100.

As used herein, a trailing stage is the last gain stage in the plurality of gain stages, and a non-trailing stage is one of the gain stages other than the trailing stage. In FIG. 1, the Nth gain stage is the trailing stage of the multi-stage amplifier 100, while the first gain stage 131, the second gain stage 132 and the (N−1)th gain stage 133 are non-trailing stages.

As defined herein, each gain stage comprises a differential amplifier unit configured to generate a pair of differential outputs from a pair of differential inputs. The differential amplifier unit may comprise one or more individual differential amplifiers. Regardless of whether one or more individual differential amplifiers are included in the differential amplifier unit, the differential amplifier unit may have an inherent DC offset, the compensation for which is a goal of the present invention.

As used herein in the specification and in the appended claims, DC offset cancellation means that an inherent DC offset of a certain electronic circuit such as an amplifier is compensated for by some means in order that a resultant DC offset present at an output of this certain electronic circuit can be made small, reduced, minimized or even eliminated.

An aspect of the present invention is to provide a multi-stage amplifier incorporating DC offset cancellation for reducing a residual DC offset at the output of the amplifier.

The inventors make an observation that, for a multi-stage amplifier having a plurality of gain stages, a substantial amount of a residual DC offset present at an output of an intermediate gain stage does not carry over to an output of a gain stage immediately next to this intermediate gain stage, provided that a DC offset canceller is employed in such immediately next gain stage. The inventors further observe that inherent limitations of the DC offset canceller (such as an inherent DC offset of a sensing amplifier used in an analog DC offset cancellation module as mentioned above) cause the presence of a new residual DC offset at the output of this immediately next gain stage. By controlling inherent limitations of a DC offset canceller employed at the trailing stage of the multi-stage amplifier, the residual DC offset at the output of the multi-stage amplifier can be reduced. The present invention is developed based on this result.

Figure 2:
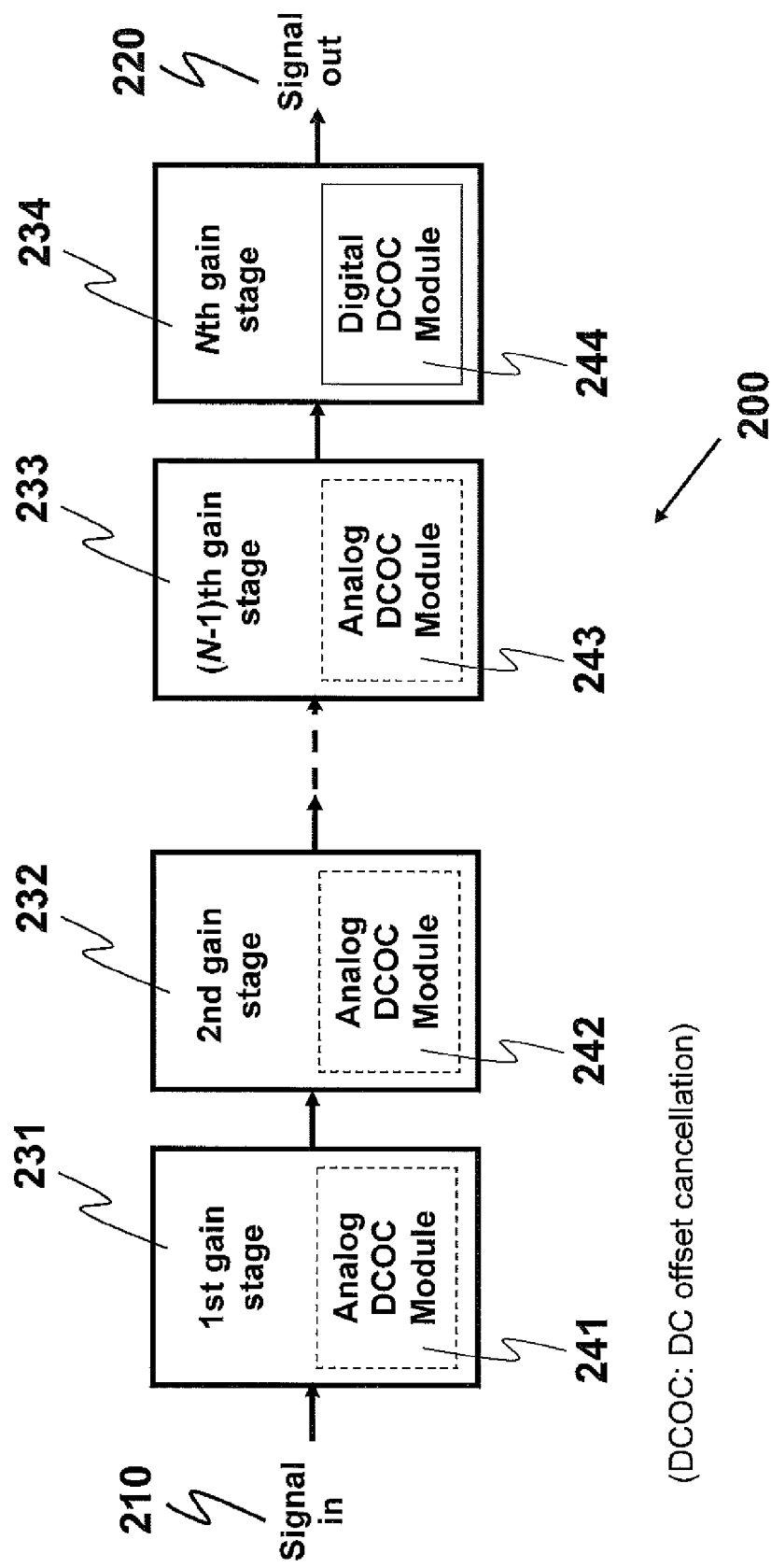
FIG. 2 depicts a multi-stage amplifier incorporating DC offset cancellation in accordance with an embodiment of the invention.

An exemplary embodiment of the present invention is shown in FIG. 2. A multi-stage amplifier 200 comprises N series-connected gain stages, of which the Nth gain stage is a trailing stage 234. The trailing stage 234 comprises a digital DC offset cancellation module 244 configured to compensate for a DC offset of the trailing stage's differential amplifier unit. The inventors observe that a comparator, as will be evidenced soon, can be used as an input stage of the digital DC offset cancellation module 244. Furthermore, the inventors observe that an inherent DC offset of a comparator can be made very small. For example, an auto-zero voltage comparator can achieve an inherent DC offset less than 1 mV. On the other hand, an analog implementation of a DC offset canceller usually involves an input stage comprising a sensing amplifier, which has an inherent DC offset typically around 10 mV. In the exemplary embodiment, the digital DC offset cancellation module 244 comprises a comparator coupled to the pair of differential outputs of a differential amplifier unit of the trailing stage 234 for receiving a pair of differential outputs of this differential amplifier as a pair of inputs for the comparator. Preferably, the comparator is configured to have an inherent DC offset that is substantially small. The comparator may be an auto-zero voltage comparator.

Since DC offsets present at outputs of non-trailing stages, such as a first gain stage 231, a second gain stage 232 and an (N−1)th gain stage 233 in FIG. 2, are compensated for by the digital DC offset cancellation module 244, it follows that DC offset cancellation for these non-trailing stages are less critical than for the trailing stage 234. It is optional that not all non-trailing stages employ DC offset cancellation.

However, as is mentioned above, a digital DC offset canceller in general has a longer response time than an analog one. Besides, the inventors make the following additional observations. For a gain stage that is programmable in gain, the response time of a digital DC offset canceller used for this gain stage is typically much longer than the response time of an analog one when the gain changes. Furthermore, the digital DC offset canceller usually gives rise to a substantial change in a residual DC offset at an output of the programmable gain stage when the gain changes. On the other hand, if an analog DC offset canceller is used for the programmable gain stage, the residual DC offset is substantially stable even in the presence of a change of the gain.

Advantageously, it is preferable that, for a non-trailing stage selected from the series-connected gain stages other than the trailing stage 234, an analog DC offset cancellation module configured to compensate for a DC offset of the non-trailing stage is used. For example, optional analog DC offset cancellation modules 241, 242 and 243 may be employed in the gain stages 231, 232 and 233, respectively. The non-trailing stage using the analog DC offset cancellation module may be programmable in gain. Using the analog canceller for the non-trailing stage having a programmable gain allows a residual DC offset at an output signal 220 of the multi-stage amplifier 200 to be cancelled automatically (i.e. in real-time or having a substantially short response time), and substantially removes variation of the residual DC offset even in a change of the gain.

Figure 3:
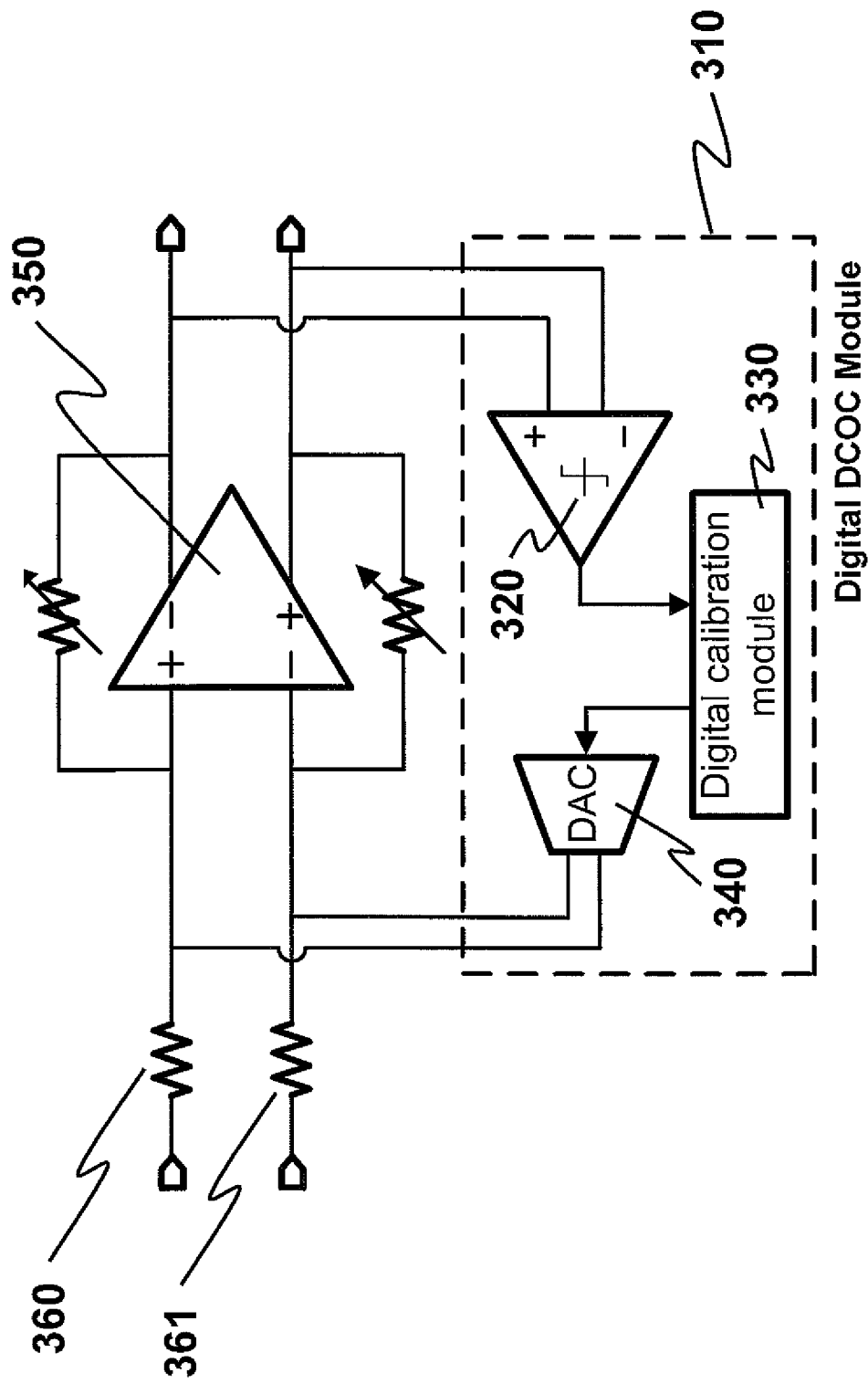
FIG. 3 depicts a trailing stage of a multi-stage amplifier in accordance with an embodiment of the invention.

In one embodiment, a digital DC offset cancellation module, whose schematic diagram is depicted in FIG. 3, is used in the trailing stage of the multi-stage amplifier. As shown in FIG. 3, a differential amplifier unit 350 is used in the trailing stage. A digital DC offset cancellation module 310 comprises a comparator 320 coupled to a pair of differential outputs of the differential amplifier unit 350. Although FIG. 3 shows that an inverting output of the differential amplifier unit 350 is connected to a non-inverting input of the comparator 320, and a non-inverting output of the differential amplifier unit 350 is connected to an inverting input of the comparator 320, the present invention is not limited only to this arrangement. A digital-to-analog converter (DAC) 340 having a pair of DAC outputs coupled to the pair of differential inputs of the differential amplifier unit 350 is included in the digital DC offset cancellation module 310. The DAC 340 is used for generating a pair of controllable currents at the pair of DAC outputs in order to introduce an additional voltage difference across the differential inputs of the differential amplifier unit 350. The additional voltage difference is obtained by setting the two controllable currents to desired amounts so as to produce different voltage drops desired for compensating for an inherent DC offset of the differential amplifier unit 350 when portions of the controllable currents flow through resistors 360, 361. The digital DC offset cancellation module 310 further comprises a digital calibration module 330. Using an output of the comparator 320 as input information, the digital calibration module 330 is configured to control the DAC 340 to generate the pair of controllable currents so as to compensate for the DC offset of the differential amplifier unit 350. Note that in the digital DC offset cancellation module 310, an ADC is not required to be implemented.

The digital calibration module 330 uses an algorithm to control the DAC 340 in generating the pair of controllable currents to desired amounts that facilitate compensation of the DC offset. Optionally, Successive Approximation Register (SAR) logic may be used to implement the algorithm.

Figure 4:
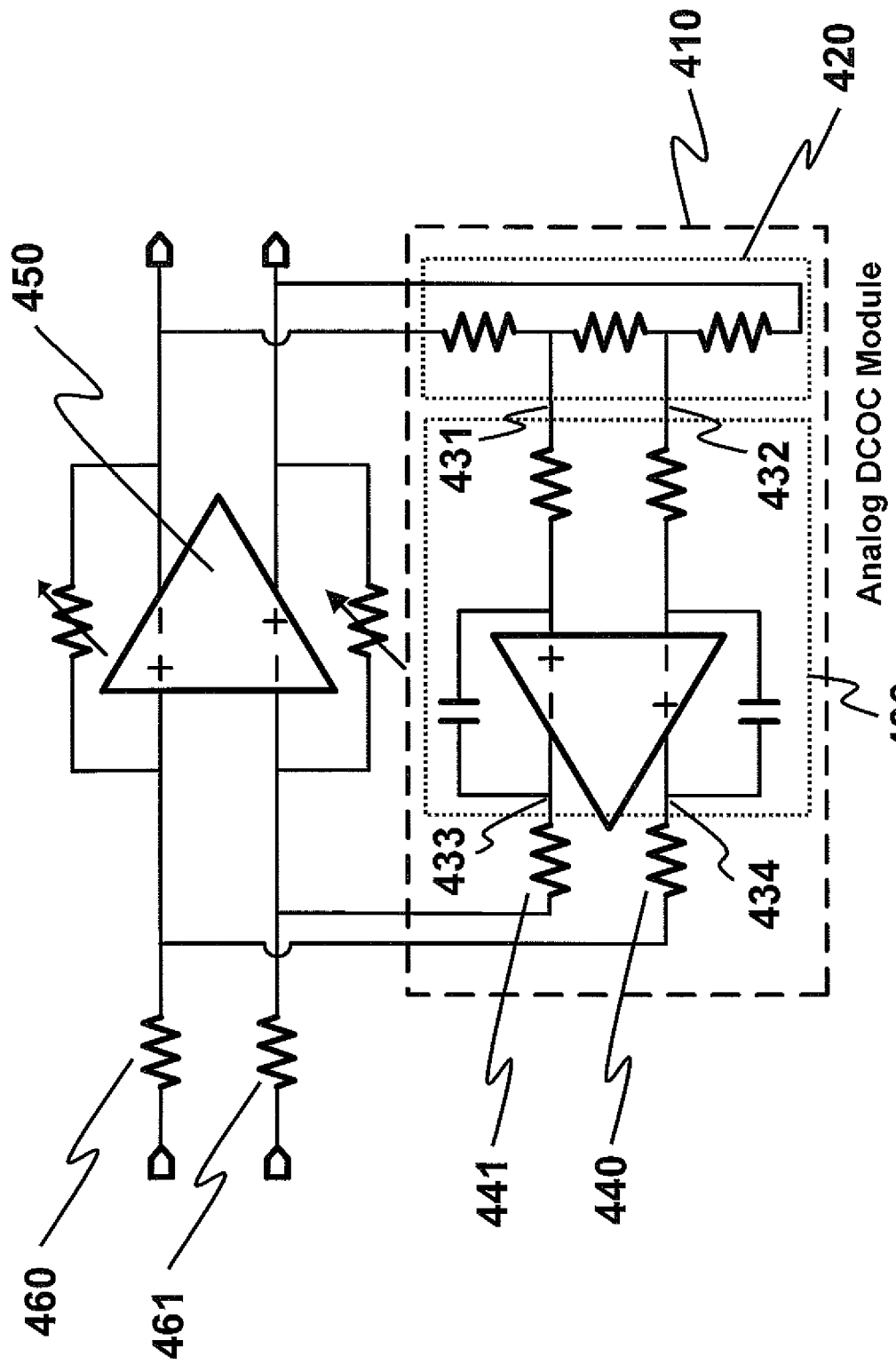
FIG. 4 depicts a non-trailing stage of a multi-stage amplifier in accordance with an embodiment of the invention.

In another embodiment, an analog DC offset cancellation module, whose schematic diagram is depicted in FIG. 4, is used in a non-trailing stage of the multi-stage amplifier. As shown in FIG. 4, an analog DC offset cancellation module 410 is used to compensate for an inherent DC offset of a differential amplifier unit 450 used in the non-trailing stage. The analog DC offset cancellation module 410 comprises an input resistor ladder 420 having a pair of ends coupled to the pair of differential outputs of the differential amplifier unit 450. The input resistor ladder 420 is used to process the pair of differential outputs to produce two voltages for feeding to a low-pass filter 430. As an example, the low-pass filter 430 is realized as an active RC filter as shown in FIG. 4. The low-pass filter 430 generates a first filter output 433 and a second filter output 434 for low-pass filtering a first filter input 431 and a second filter input 432 both obtained from the input resistor ladder 420. This low-pass filtering enables the low-pass filter 430 to yield a value of DC offset possibly present at the pair of differential outputs of the differential amplifier unit 450. A first output resistor 441 is used to connect the first filter output 433 and one of the differential inputs of the differential amplifier unit 450. A second output resistor 440 is also used to connect the second filter output 434 and another one of the differential inputs. An additional voltage difference for compensating for the inherent DC offset of the differential amplifier 450 is developed by drawing or injecting different amounts of current across resistors 460, 461.

Another aspect of the present invention is to provide a method for compensating for a DC offset of a multi-stage amplifier. In an exemplary embodiment of the method, a digital DC offset cancellation module is used in a trailing stage of the multi-stage amplifier to compensate for a DC offset of the trailing stage's differential amplifier unit. In particular, the digital DC offset cancellation module has a comparator having a pair of inputs coupled to the differential amplifier's pair of differential outputs. It is preferable that the comparator is configured to have an inherent DC offset that is substantially small. In this regard, an auto-zero voltage comparator may be used. Preferably, the method further comprises using an analog DC offset cancellation module to compensate for a DC offset of a non-trailing stage of the multi-stage amplifier.

The present invention may be embodied in other specific forms without departing from the spirit or essential characteristics thereof. The present embodiment is therefore to be considered in all respects as illustrative and not restrictive. The scope of the invention is indicated by the appended claims rather than by the foregoing description, and all changes that come within the meaning and range of equivalency of the claims are therefore intended to be embraced therein.

What is claimed is:

1. A multi-stage amplifier having a plurality of series-connected gain stages each of which comprises a differential amplifier unit configured to generate a pair of differential outputs from a pair of differential inputs, wherein:
    a trailing stage in the plurality of series-connected gain stages comprises a digital DC offset cancellation module configured to compensate for a DC offset of the trailing stage's differential amplifier unit, wherein the digital DC offset cancellation module comprises a comparator coupled to the pair of differential outputs of the trailing stage's differential amplifier unit for receiving such pair of differential outputs as a pair of inputs for the comparator; and
    a non-trailing stage selected from the series-connected gain stages other than the trailing stage comprises an analog DC offset cancellation module configured to compensate for a DC offset of the non-trailing stage.

2. The multi-stage amplifier of claim 1, wherein one or more of the series-connected gain stages are programmable in gain, so that the multi-stage amplifier has a gain that is programmable.

3. The multi-stage amplifier of claim 1, wherein the differential amplifier unit of any of the series-connected gain stages comprises one or more individual differential amplifiers.

4. The multi-stage amplifier of claim 1, wherein the comparator is configured to have an inherent DC offset that is substantially small.

5. The multi-stage amplifier of claim 1, wherein the comparator is an auto-zero voltage comparator.

6. The multi-stage amplifier of claim 1, wherein the digital DC offset cancellation module further comprises:
    a digital-to-analog converter (DAC) having a pair of DAC outputs coupled to the pair of differential inputs of the trailing stage's differential amplifier unit, for generating a pair of controllable currents at the pair of DAC outputs in order to introduce an additional voltage difference across the differential inputs of the trailing stage's differential amplifier unit; and
    a digital calibration module configured to, using an output of the comparator as input information to the digital calibration module, control the DAC to generate the pair of controllable currents so as to compensate for the DC offset of the trailing stage's differential amplifier unit;
thereby enabling the DC offset to be compensated for without involving an analog-to-digital converter.

7. The multi-stage amplifier of claim 6, wherein the digital calibration module uses Successive Approximation Register (SAR) logic.

8. The multi-stage amplifier of claim 1, wherein the non-trailing stage is programmable in gain.

9. The multi-stage amplifier of claim 1, wherein the analog DC offset cancellation module comprises:
- an input resistor ladder having a pair of ends coupled to the pair of differential outputs of the non-trailing stage's differential amplifier unit;
- a low-pass filter generating a first filter output and a second filter output, for low-pass filtering a first filter input and a second filter input both obtained from the input resistor ladder;
- a first output resistor, a first end of which connects to the first filter output and a second end of which connects to one of the differential inputs o the non-trailing stage's differential amplifier unit; and
- a second output resistor, a first end of which connects to the second filter output and a second end of which connects to another one of the differential inputs of the non-trailing stage's differential amplifier unit.

10. The multi-stage amplifier of claim 9, wherein the low-pass filter is an active RC filter.

11. A method for compensating for a DC offset of a multi-stage amplifier, the multi-stage amplifier having a plurality of series-connected gain stages each of which comprises a differential amplifier unit configured to generate a pair of differential outputs from a pair of differential inputs, the method comprising:
- for a trailing stage in the plurality of series-connected gain stages, using a digital DC offset cancellation module to compensate for a DC offset of the trailing stage's differential amplifier unit, wherein the digital DC offset cancellation module has a comparator coupled to the pair of differential outputs of the trailing stage's differential amplifier unit for receiving such pair of differential outputs as a pair of inputs for the comparator; and
- for a non-trailing stage selected from the series-connected gain stages other than the trailing stage, using an analog DC offset cancellation module to compensate for a DC offset of the non-trailing stage.

12. The method of claim 11, wherein the comparator is configured to have an inherent DC offset that is substantially small.

13. The method of claim 11, wherein the comparator is an auto-zero voltage comparator.

14. A multi-stage amplifier having a plurality of series-connected gain stages each of which comprises a differential amplifier unit configured to generate a pair of differential outputs from a pair of differential inputs, wherein:
- a trailing stage in the plurality of series-connected gain stages comprises a digital DC offset cancellation module configured to compensate for a DC offset of the trailing stage's differential amplifier unit, wherein the digital DC offset cancellation module comprises a comparator coupled to the pair of differential outputs of the trailing stage's differential amplifier unit for receiving such pair of differential outputs as a pair of inputs for the comparator;
- a digital-to-analog converter (DAC) having a pair of DAC outputs coupled to the pair of differential inputs of the trailing stage's differential amplifier unit, for generating a pair of controllable currents at the pair of DAC outputs in order to introduce an additional voltage difference across the differential inputs of the trailing stage's differential amplifier unit; and
- a digital calibration module configured to, using an output of the comparator as input information to the digital calibration module, control the DAC to generate the pair of controllable currents so as to compensate for the DC offset of the trailing stage's differential amplifier unit;

thereby enabling the DC offset to be compensated for without involving an analog-to-digital converter.

15. The multi-stage amplifier of claim 14, wherein one or more of the series-connected gain stages are programmable in gain, so that the multi-stage amplifier has a gain that is programmable.

16. The multi-stage amplifier of claim 14, wherein the differential amplifier unit of any of the series-connected gain stages comprises one or more individual differential amplifiers.

17. The multi-stage amplifier of claim 14, wherein the comparator is configured to have an inherent DC offset that is substantially small.

18. The multi-stage amplifier of claim 14, wherein the comparator is an auto-zero voltage comparator.

19. The multi-stage amplifier of claim 14, wherein the digital calibration module uses Successive Approximation Register (SAR) logic.

* * * * *